United States Patent
Connolly et al.

(10) Patent No.: US 10,937,485 B2
(45) Date of Patent: *Mar. 2, 2021

(54) REDUNDANT VOLTAGE REGULATOR FOR MEMORY DEVICES

(71) Applicant: International Business Machines Corporation, Armonk, NY (US)

(72) Inventors: Brian J. Connolly, Williston, VT (US); Kyu-Hyoun Kim, Chappaqua, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/577,644

(22) Filed: Sep. 20, 2019

(65) Prior Publication Data

US 2020/0013449 A1 Jan. 9, 2020

Related U.S. Application Data

(63) Continuation of application No. 15/843,480, filed on Dec. 15, 2017, now Pat. No. 10,468,088.

(51) Int. Cl.
*G11C 5/14* (2006.01)
*G11C 11/4074* (2006.01)
(Continued)

(52) U.S. Cl.
CPC .......... *G11C 11/4074* (2013.01); *G11C 5/04* (2013.01); *G11C 5/147* (2013.01); *G11C 29/702* (2013.01); *G11C 5/14* (2013.01); *G11C 5/141* (2013.01)

(58) Field of Classification Search
CPC ....... G11C 11/4074; G11C 5/04; G11C 5/147; G11C 29/702; G11C 5/14; G11C 5/141
(Continued)

(56) References Cited

U.S. PATENT DOCUMENTS 6,191,499 B1 * 2/2001 Severson .............. G06F 1/26
  307/31
7,360,104 B2   4/2008 Harris et al.
(Continued)

FOREIGN PATENT DOCUMENTS

WO   WO2016122461 A1   8/2016
WO   WO2016137503 A1   9/2016

OTHER PUBLICATIONS

List of IBM Patents or Patent Applications Treated as Related.

*Primary Examiner* — Ly D Pham
(74) *Attorney, Agent, or Firm* — Scully, Scott, Murphy & Presser, P.C.

(57) ABSTRACT

A memory subsystem is disclosed comprising at least one memory module, the memory module having a substrate to which a plurality of memory chips is mounted and a voltage regulator, the voltage regulator receiving a power supply signal from a system power supply and outputting two or more power signals, each power signal providing a different, regulated voltage, which regulated voltages are each routed to each of the memory chips; and a redundant voltage regulator external to and not mounted on the memory module and configured to output two or more power signals, providing external different, regulated voltages which are the same voltages as the voltages output by the voltage regulator on the memory module, and supplying the two or more signals to the memory module.

20 Claims, 6 Drawing Sheets

(51) Int. Cl.
*G11C 5/04* (2006.01)
*G11C 29/00* (2006.01)

(58) Field of Classification Search
USPC .......................................................... 365/226
See application file for complete search history.

(56) References Cited

U.S. PATENT DOCUMENTS

| | | |
|---|---|---|
| 7,876,592 B2 | 1/2011 | Berke |
| 8,205,107 B2 | 6/2012 | Berke et al. |
| 8,782,452 B2 | 7/2014 | Bacchus et al. |
| 9,405,339 B1 * | 8/2016 | Espinoza-Ibarra .... G11C 5/143 |
| 10,192,626 B1 * | 1/2019 | Bonitz ................... G11C 16/30 |
| 2006/0174140 A1 * | 8/2006 | Harris ....................... G11C 5/04 |
| | | 713/300 |
| 2008/0093933 A1 * | 4/2008 | Pracht ................. H05K 1/0262 |
| | | 307/116 |
| 2015/0234726 A1 | 8/2015 | Moran et al. |

* cited by examiner

REDUNDANT VOLTAGE REGULATOR FOR MEMORY DEVICES

BACKGROUND

The present invention relates to computer architecture, processing and memory systems, and more specifically to powering memory systems/subsystems.

With recent advancement of information technology and wide use of the Internet to store and process information, more and more demands are placed on the acquisition, processing, storage and dissemination of information by computing systems. Computing systems are being developed to increase the speed at which the computers are able to execute increasingly complex applications for business, personal use, and entertainment. Overall computer system performance is affected by each of the key elements of the computer structure, including the performance/structure of the processors, any memory caches, input/output (I/O) subsystems, efficiency of the memory control functions, the performance of the memory devices and systems, and any associated memory interface elements, and the type and structure of the memory interconnect interfaces.

The constantly increasing speed of processors which execute increasingly complex applications places more rigorous performance demands on all of the other subsystems in the computer, including the memory subsystem, where data is stored, accessed, and updated numerous times during the operation of a software application. The time consumed by memory read/write operations is a major factor in the ultimate speed and efficiency of a computer system. The memory subsystem of most computers is normally operated by a memory controller. The task of memory controllers is to move data between the computer's memory subsystem and its one or more processors as quickly and efficiently as possible. A computer's memory subsystem often comprises memory modules, usually one or more dual in-line memory modules (DIMMs) that include several dynamic random access memory (DRAM) devices.

In many memory subsystems, a memory controller may control multiple memory channels, where each channel may include one or more Dual In-line Memory Modules (DIMMs), where the DIMMs may be arranged in one or more ranks. Computing demands require the ability to access an increasing number of higher density memory devices at faster and faster access speeds. The memory subsystem is one of the largest users of electrical power in a computer system. The large power consumption may generate a lot of heat, which may further effect computing performance.

Extensive research and development efforts are invested by the industry to create improved and or innovative solutions to maximize overall system performance by improving the memory system/subsystem design and/or structure and the methods by which the memory system/subsystem operates. Such efforts have resulted in the development of distributed memory systems, distributed buffer memory systems, registered DIMMs (RDIMMs) and load reduced DIMMs (LRDIMMs), and other systems, specifications and standards such as, for example, DDR4 and DDR5, which provide for increased memory performance.

In one example, a distributed memory system may include a plurality of memory devices, one or more Address Chips (AC), also known as memory control circuits, and a plurality of data circuits, also known as data buffer circuits or DC chips (DC). There are communication links or buses between a Host processor and the memory control circuits and data buffer circuits. There is also a communication link or bus from the memory control circuits to the data buffer circuits. There are also communication links between the memory devices, e.g., DRAMS, and the memory control circuits and the data buffer circuits. Bandwidth limitations on communication links can affect performance of memory systems. The amount of data, command, control and response signals sent over communication links and busses between the Host, the memory control circuits, the data buffer circuits, and the memory devices, which includes the bandwidth allocated to transmit store data control functions, e.g., store data address tags and locations, impacts performance of memory systems.

SUMMARY

The summary of the disclosure is given to aid understanding of the memory system, architectural structure and method of storing and fetching data, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory systems, architectural structure and method of operation to achieve different effects.

In one embodiment, a system is disclosed including at least one memory module including a plurality of dynamic random access memory devices mounted on the module, and a first voltage regulator mounted on the module, the first voltage regulator configured to supply at least one of a plurality of voltages to a plurality of voltage domains for supplying voltage to the plurality of memory devices, and a system board including a second external voltage regulator configured to supply voltage to the first voltage regulator, and a third redundant voltage regulator, the third redundant voltage regulator configured to supply at least one of a plurality of voltages to the plurality of voltage domains on the memory module, wherein the at least one of the plurality of voltages supplied by the third redundant voltage regulator is the same as the at least one voltage supplied by the first voltage regulator.

In another embodiment a memory subsystem is disclosed comprising at least one memory module, the memory module having a substrate to which a plurality of memory chips is mounted and a voltage regulator, the voltage regulator receiving a power supply signal from a system power supply and outputting two or more power signals, each power signal providing a different, regulated voltage, which regulated voltages are each routed to each of the memory chips; and a redundant voltage regulator external to and not mounted on the memory module and configured to output two or more power signals, providing external different, regulated voltages which are the same voltages as the voltages output by the voltage regulator on the memory module, and supplying the two or more signals to the memory module.

In a further embodiment a memory module is disclosed comprising a plurality of memory devices and a voltage regulator, the voltage regulator configured to receive a first power signal of a first voltage level and output at least a second and third power signal, each of the second and third power signals providing second and third different regulated, voltage levels each lower than the first voltage level, wherein the module is configured and adapted to receive the first power signal of the first voltage level and supply the first power signal to the voltage regulator, and wherein the module is configured and adapted to receive a fourth and fifth power signal, the fourth power signal having a voltage level equal to the second voltage level, and the fifth voltage level equal to the voltage of the third voltage level, wherein the fourth voltage level is supplied in parallel to the second voltage output by the voltage regulator, and the fifth voltage is supplied in parallel to the third voltage output by the voltage regulator.

A method of powering memory devices comprising in one embodiment supplying at least two different, regulated voltages from a voltage regulator mounted on a memory module to two separate voltage domains; and supplying at least two different, regulated voltages from a redundant voltage regulator to the memory module, the at least two different regulated voltages supplied by the redundant voltage regulator being the same voltages supplied by the voltage regulator mounted on the memory module.

BRIEF DESCRIPTION OF THE DRAWINGS

The various aspects, features and embodiments of the memory system, architectural structure and its method of operation will be better understood when read in conjunction with the figures provided. Embodiments are provided in the figures for the purpose of illustrating aspects, features and/or various embodiments of the memory system, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of the memory system, architectural structure and method of operation, however, it will be understood by those skilled in the art that different and numerous embodiments of the memory system, architectural structure and method of operation may be practiced without those specific details, and the claims and invention should not be limited to the embodiments, subassemblies, features, processes, methods, aspects, features of details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

Figure 1:
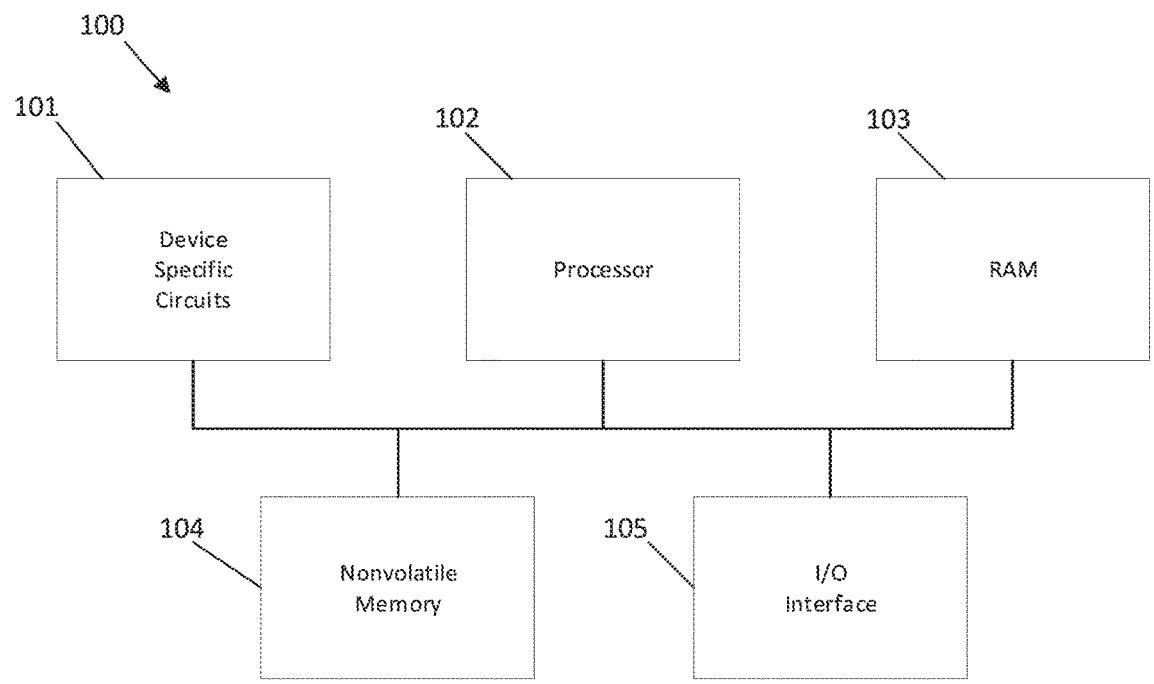
FIG. 1 depicts a general computing or data processing system in accordance with one embodiment.

A computing or data processing system 100 suitable for storing and/or executing program code may take many forms and in one embodiment may include at least one processor 102, which may be or be part of a controller, coupled directly or indirectly to memory devices or elements through a system bus, as shown in FIG. 1. Computing system 100 in FIG. 1 is shown with a processor 102, Random Access Memory (RAM) 103, nonvolatile memory 104, device specific circuits 101, and I/O interface 105. Alternatively, the RAM 103 and/or nonvolatile memory 104 may be contained in the processor 102 as could the device specific circuits 101 and I/O interface 105. The processor 102 may comprise, for example, an off-the-shelf microprocessor, custom processor, Field Programmable Gate Array (FPGA), Application Specific Integrated Circuit (ASIC), discrete logic, etc. The RAM 103 is typically used to hold variable data, stack data, executable instructions, etc., and may include Dynamic Random Access Memory or DRAM.

According to various approaches, the nonvolatile memory 104 may comprise any type of nonvolatile memory such as, but not limited to, Electrically Erasable Programmable Read Only Memory (EEPROM), flash Programmable Read Only Memory (PROM), battery backup RAM, hard disk drives, etc. The nonvolatile memory 104 is typically used to hold the executable firmware and any nonvolatile data containing programming instructions that can be executed to cause the processor 102 to perform certain functions.

In some embodiments, the I/O interface 105 may include a communication interface that allows the processor 102 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The computing system 100 may communicate with an external device via the communication interface 105 in any communication protocol such as Automation/Drive Interface (ADI).

Figure 2:
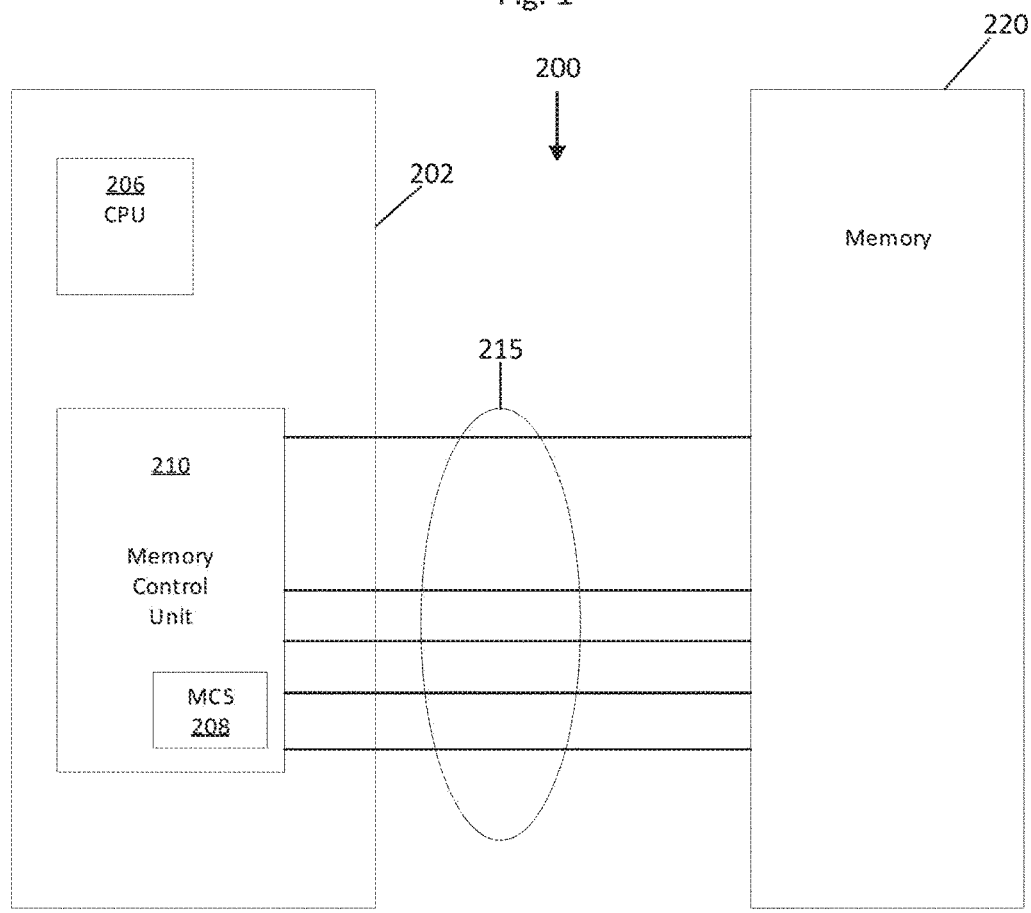
FIG. 2 depicts a memory subsystem in accordance with an embodiment.

FIG. 2 depicts an exemplary memory system 200 that may be part of a larger computer system structure or network. The computer system 200 includes a control processor system 202, which is a processing subsystem that includes at least one processor unit (CPU) 206 that may be configured to interface with a Memory Control Unit (MCU) 210. The processor or CPU 206 may be a module that processes read, write, and configuration requests from a system controller (not depicted). The processor 206 may be a multi-core processor. The MCU 210 may include a memory controller synchronous (MCS) 208, also referred to as a memory controller, that controls communication with one or more memory devices 250 (not shown in FIG. 1) in a memory subsystem 220. The MCU 210 and the MCS 208 may include one or more processing circuits, or processing may be performed by or in conjunction with the processor 206. The control processor system 202 communicates with the memory subsystem 220 through a communications bus 215. Control processor system 202, processor or CPU 206, memory control unit 210, and MCS 208, individually and collectively, may be referred to herein as the Host. The Host as used herein is used broadly to refer to a processor, controller or device that sends and receives command and/or control signals to a memory system or subsystem. The Host may also send and receive data signals from a memory system or subsystem.

Memory systems, memory architecture, and/or methods of powering a memory system or subsystem, including, for example, a distributed memory system, are disclosed. In one embodiment, a memory system, architectural structure, and/or method of powering memory systems, including memory devices, is disclosed. The memory system as disclosed in more detail below may include one or more memory devices, and one or more data buffer circuits. The memory system may further include one or more memory control circuits, which may in one embodiment include a memory controller to control the flow of data going to and from the memory devices. The memory control circuit may include in one embodiment a registered clock driver or RCD. There may be communication links or buses for transferring data, commands, responses, and/or signals between a Host, the memory devices, the data buffer circuits, and/or the memory control circuits. For ease of illustration many of the communications links have been eliminated in the figures.

A computer's memory subsystem often comprises memory modules, usually one or more dual in-line memory modules (DIMMs), which usually include a plurality of memory devices, e.g., dynamic random access memory (DRAM) devices. The memory system in one embodiment may include a plurality of memory devices, one or more memory control circuits, and one or more data buffer circuits, all arranged on a module as a DIMM. In one embodiment, the memory control circuit receives signals from a Host processor and outputs command and control signals. The memory control circuit may include a memory controller, and in one embodiment, may have a scheduler, which may be in the form of a circuit.

The memory control circuit, e.g., the scheduler, may optimize the order of operations and instructions, and sends out command signals (e.g., instructions) to the data buffer circuits and the memory devices. In one embodiment a memory controller, scheduler and/or circuit schedules fetch operations, store operations, and memory device, e.g., DRAM, periodical operations such as, for example, refresh operations to optimize system performance. As stated above, there are communication links or buses between the Host (e.g., processor), the memory control circuits, and the data buffer circuits, and/or the memory devices. In one embodiment, there is a communication bus or link from the memory control circuit to the data buffer circuits. In one embodiment there may also be communication buses and links between the Host and the memory control circuit, and separate communication buses or links between Host and the data buffer circuits. The memory system and/or architectural structure may further include a communication link or bus between the memory devices and the memory control circuit, and/or the data buffer circuit.

Figure 3:
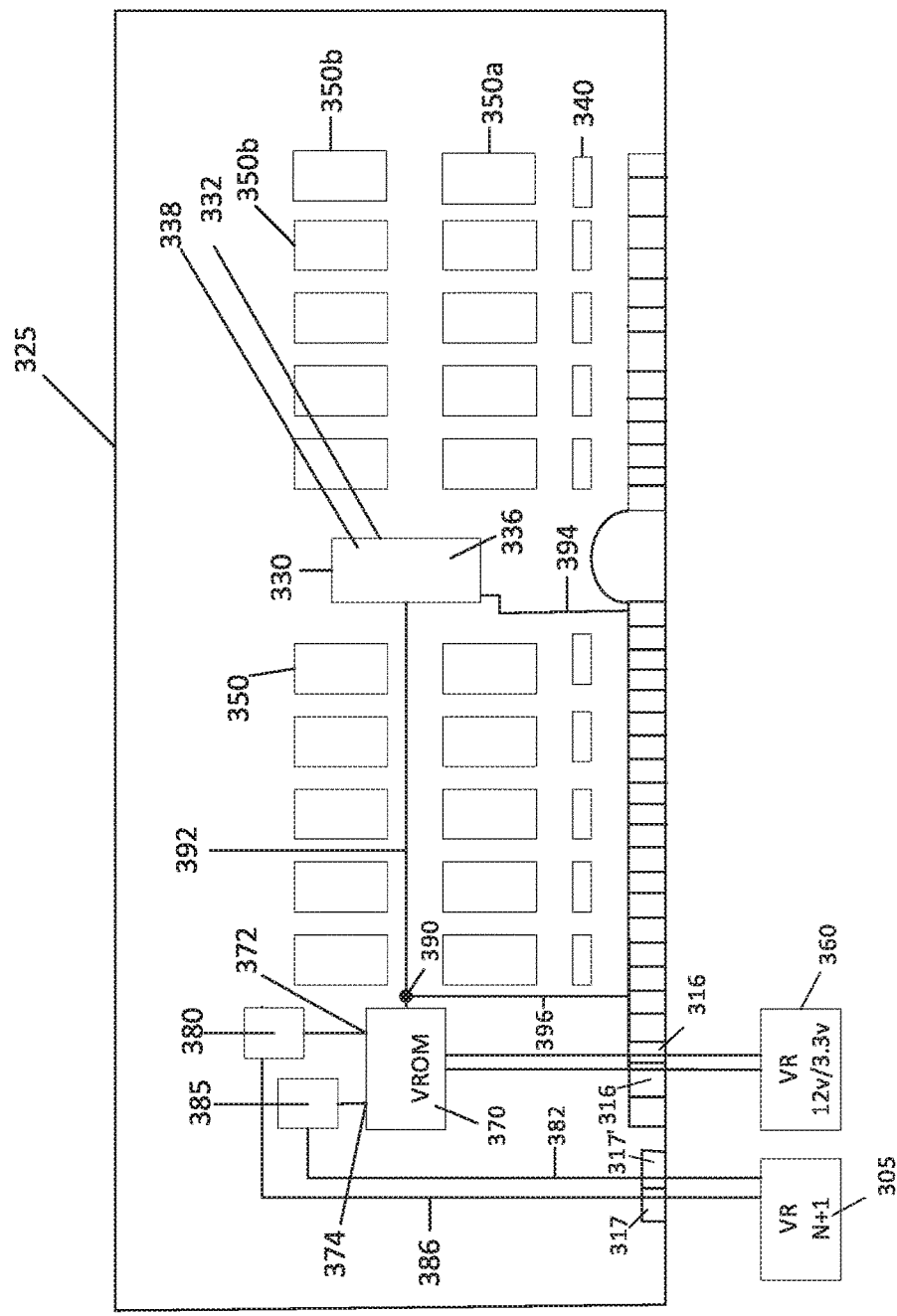
FIG. 3 depicts a memory subsystem in accordance with an embodiment having a voltage regulator on a memory module.
Figure 4:
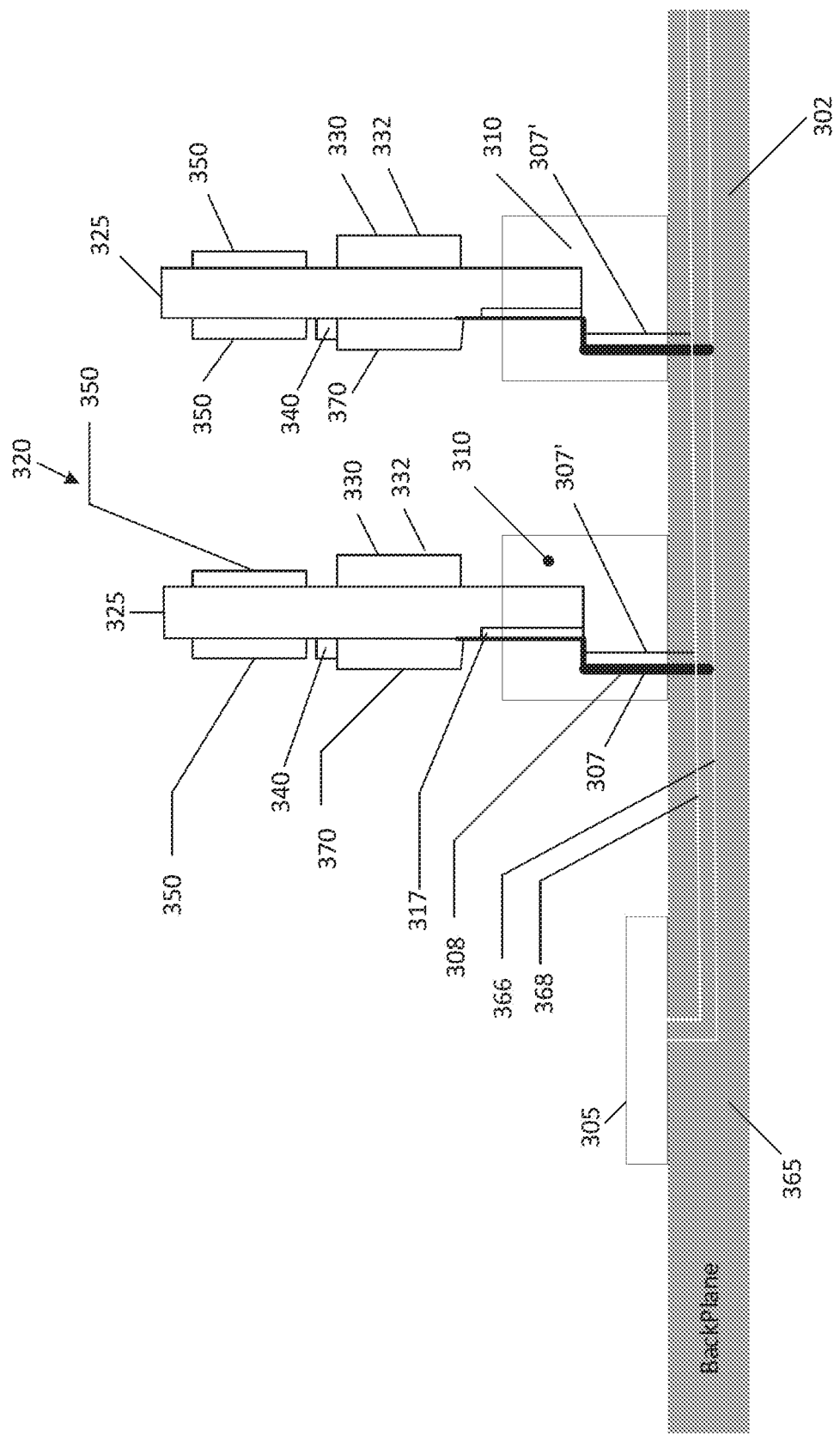
FIG. 4 depicts a memory subsystem connected in sockets on a system board according to one embodiment.
Figure 5:
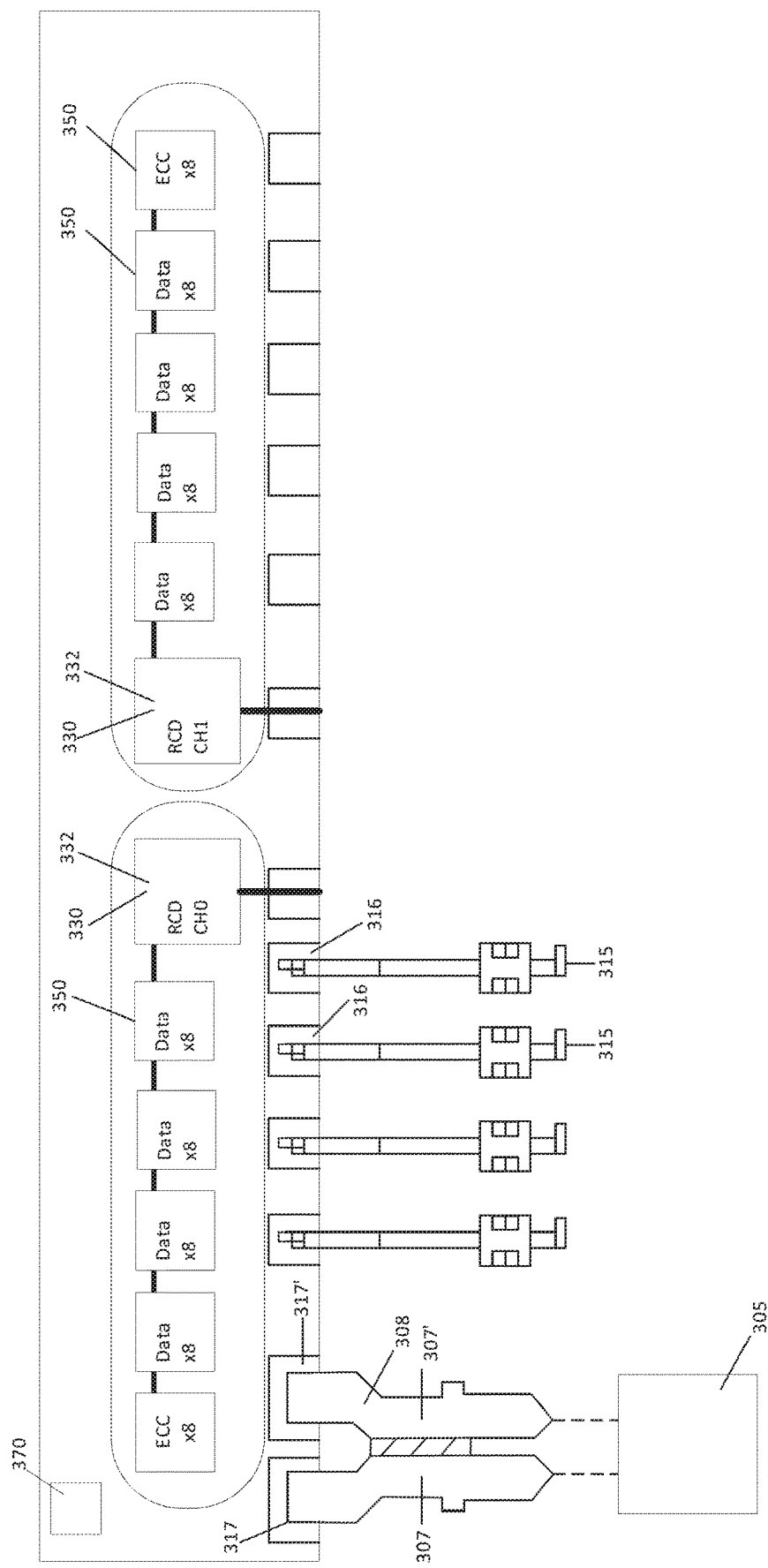
FIG. 5 depicts a side view of a memory subsystem with signal pins and power blade pins in accordance with one embodiment.

FIGS. 3, 4 and 5 depicts examples of a memory subsystem 320. FIG. 3 shows memory system 320 with one memory module, e.g., Dual Inline Memory Modules or DIMMs 325, but it will be appreciated that memory subsystem 320 may contain more are less DIMMs 325 (See e.g., FIG. 4). The DIMMs 325 may be arranged in channels and ranks, with one or more ranks or channels on a DIMM 325, or on multiple DIMMs 325. Each DIMM 325 may contain one or more volatile memory devices, e.g., Dynamic Random Access Memory chips or DRAMs 350. The memory devices 350 may be integrated circuits or chips and form the basic memory cells that hold bits of information. The memory cells in a memory device, e.g., DRAM, are usually arranged in banks, where each bank is an array of rows and columns.

The memory subsystem may also include one or more memory control circuits 330, and one or more data buffer or data circuits or chips (DC) 340. The memory control circuit 330 manages the flow of data going to and from the memory devices 350. The memory control circuit typically receives signals such as command and control signals from a Host, e.g., a Host processor. The control signals may include address locations or tags on where to store data in the memory devices and/or data buffer circuits. The memory control circuit may output command and control signals to the memory devices. The memory control circuits 330 for ease of reference may also be referred to as address and command circuits, AC circuits or AC chips. The memory control circuit 330 may or may not have a Registered Clock Driver (RCD) 332. Each memory module 325 may have one RCD 332 (see e.g., FIGS. 3 and 4) or multiple RCDs 332 as shown in FIG. 5. The memory control circuit 330 in one embodiment may have a memory controller. The memory control circuit 330 or memory controller may have a scheduler 338. The memory control circuit 330, memory controller, and/or scheduler 338 may optimize the order of operations and instructions, and sends out signals to the data buffer circuits and the memory devices. The memory control circuit 330/memory controller/memory scheduler 338 may reorder the sequence of operations. The memory control circuit may or may not be located on the board or module, e.g., DIMM, with the memory devices. In embodiments, as shown in FIGS. 3 and 4, the memory control circuits 330 are formed as an integrated circuit or chip and are located on the module 325 with the memory devices 350.

The data buffer circuits 340 buffer, receive, transmit, and/or transfer data between the Host, e.g., control processor system 302, and the memory devices 350. The data buffer circuits may or may not be located on the same board or module, e.g., DIMM, as the memory devices and/or the memory control circuits. The data buffer circuits 340 in one embodiment are also formed as integrated circuits or chips and are located on the module 325 with the memory devices 350 as shown in FIGS. 3 and 4. The data buffer circuits may also be referred to as data circuits, DC circuits, and/or DC chips.

The memory or data storage system 320 may be configured to store data and to provide storage services to one or more Hosts, which can be connected to the storage system 320 directly or through a network (e.g., over the internet). The storage system may include an interface for supporting communications with the Host.

In the memory system 320 of FIG. 3, each memory module 325 is configured as a DIMM and has one memory control circuit or AC chip 330, ten (10) data buffer circuits or DC chips 340, and forty (40) memory devices 350, e.g., DRAMs. The memory control circuit 330 is configured and programmed to send command and control signals to the data buffer circuits 340 and the memory devices 350. Each memory control chip or AC chip 330 in this example manages the flow of data to and from the memory devices 350 on the module 325. Each data buffer circuit or DC chip 340 in this example interacts with and buffers data between four memory devices 350. The DIMMs may include memory devices, e.g., DRAMs, preferably in groups of ten, e.g., 10, 20, 30, 40, etc., but other configurations are contemplated. Other configurations are contemplated for the memory module 325, and for the memory subsystem 320. The memory system architecture may be formatted and structured to support DDR4 and DDR5 standards, and may include RDIMMs and LRDIMMs, although the methods, systems and architecture disclosed and taught would be applicable to other configurations, including future standards.

Power is supplied to the memory module 325 by a voltage regulator 360 associated with the system. The voltage regulator 360, labeled "VR" in FIG. 3 preferably is external to and not mounted on the memory module 325. The voltage regulator 360 may be on a system board 302, mother board, server back plane 365 or otherwise associated with the Host as shown in FIG. 4. The voltage regulator 360 may supply one or multiple voltages to the memory module 325. The voltage regulator 360 in one embodiment preferably supplies twelve (12) volts and 3.3 volts to the memory modules 325. Depending upon the design and configuration of the system, other voltages may be used and the voltage regulator 360 may supply other or multiple voltages to the memory modules 325. Power from the voltage regulator 360 is supplied to the memory module 325 through the module socket or connector 310 (shown in FIG. 4). The socket 310 has a set of pins 315 that make contact with contact pads 316 on the module 325. (See FIGS. 4 and 5.) One or more of these pins 315 may be used to supply voltage/power to the memory module 325.

A voltage regulator module 370 is mounted on the memory module 325 as shown in FIGS. 3-5. Voltage regulator module 370 may also be referred to as voltage regulator or the module (e.g., the DIMM) or VROM. Power, e.g., voltage, is supplied by voltage regulator 360 to the memory module 325, for example twelve (12) volts and 3.3 volts. The voltage or voltages supplied to the memory module 325 by the voltage regulator 360 may be supplied to the voltage regulator module 370 on the memory module 325. On-board voltage regulator module 370 converts the higher voltage, e.g. twelve (12) volts, supplied by external voltage regulator 360 into appropriate voltage levels that power the memory devices 350. The second voltage, e.g., the 3.3 volts, may be used as the source voltage for the voltage regulator module 370, meaning that the second voltage, e.g., the 3.3 volts, powers the circuits on the voltage regulator module 370. The on-board voltage regulator module 370 may also convert the power supplied by the first, preferably higher, voltage, e.g., twelve (12) volts, from the external voltage regulator 360 to power, e.g., to provide voltage to, other devices on the memory module 325, for example, the memory control circuit 330, the RCD 332 on the memory control circuit 330, the data buffer circuits 340, etc. The on-board voltage regulator 370 outputs one or more different, regulated voltage levels. While FIGS. 3-5 illustrate only one on-board voltage regulator 370, it should be appreciated that additional voltage regulators 370 may be provided on the memory modules 325 to supply the appropriate voltage (power) to the various components on the memory module 325, including the memory devices 350. In one example, the on-board voltage regulator module 370 receives twelve (12) volts and outputs or supplies a first voltage or power signal 372 (e.g., 1.1 volts) and a second voltage or power signal 374 (e.g., 1.8 volts), which may be supplied, for example, to the memory devices 350. One or more on-board voltage regulator 370 may output a plurality of additional and different voltage or power signals.

In one embodiment, the one or more on-board voltage regulators 370 outputs the different voltage (power) signals to different voltage or power domains, also referred to as power or voltage planes or lines. Each different voltage level (power) output by the one or more on-board voltage regulators 370 preferably is supplied to a different voltage (power) domain. One or more voltage regulators 370 may be used to provide voltage (power) to each voltage (power) domain or plane, and or to be used to provide voltage (power) to multiple, and/or all, voltage (power) domains on the memory module 325. In FIG. 3, the first voltage (1.1 volts) output of the on-board regulator 370 is output to voltage (power) domain 380, while the second voltage (1.8 volts) output of the on-board voltage regulator 370 is output to voltage (power) domain 385. Additional voltage (power) domains may be provided on the module 325 and supplied with a voltage (power) from the one or more on-board voltage regulators 370. On-board voltage regulators that are capable of generating tightly controlled voltage levels are preferred. The on-board voltage regulators preferably are capable of handling unregulated supply voltages in a broad range of voltage levels. A number of advantages may be obtained by utilizing one or more on-board voltage regulators 370 to supply the components, including memory devices 350, with power. For example, less power utilization, less heat dissipation, and tighter voltage tolerance to the memory devices may be some of the advantages of one or more on-board voltage regulators.

By having one or more voltage regulators 370 on the module 325 to supply power to the components on the module 325, including the memory devices 350, may expose the memory system to increased risk of failure. If one or more voltage regulators on the module fails, the contents of the memory devices 350 may be lost, system including memory system performance may be impacted, and, at worst, the system may crash resulting in lost data. In the situation where only one on-board voltage regulator 370 is used to supply power to the components on the memory module 325, the risk of failure may be increased.

As shown in FIGS. 3, 4, and 5, one or more redundant voltage regulator modules 305 may be provided on a system board 302, for example, a mother board, the back plane 365 of a server, or another location that is external to the memory module 325. One or more external redundant voltage regulators 305, labeled "VR" in FIG. 3, may be used to supply one or more regulated voltages to the memory module 325. The one or more redundant voltage regulators 305 supplement the voltage supplied to the memory module components, including the memory devices 350, by the on-board voltage regulators 370. If the on-board voltage regulators 370 fails, the one or more external redundant voltage regulator modules 305 maintain power (e.g., voltage) to the components on the memory module 325, including memory devices 350, thereby preferably maintaining the contents of the memory devices 350, and preferably preventing the system/server from crashing. The one or more redundant voltage regulators 305 preferably provide voltages to the volatile memory to enable the system Host to transfer the memory contents of the memory module 325 to a safer medium, e.g., other memory modules, until the failing memory module can be replaced.

Referring to FIG. 3-5, the redundant voltage regulator 305 may output and supply one or more power signals at different regulated voltages to the memory module 325. For example, the redundant voltage regulator 305 may output and supply 1.1 volts and 1.8 volts to the memory module 325. Additional or different power signals of different voltages may be output and supplied by redundant, external voltage regulator 305. While FIGS. 3-5 only illustrate one redundant voltage regulator 305 it can be appreciated that multiple redundant voltage regulators 305 may be utilized, with each redundant voltage regulator 305 supplying one or more voltage (power) outputs. The voltage levels supplied by the redundant voltage regulator are usually less than the voltage (e.g., 12 volts) supplied by the external voltage regulator module 360 that powers the on-board voltage regulator 370. The multiple voltages supplied by the redundant voltage regulator are generally about five (5) volts or less, and more preferably on the order of about one to about two volts, although other voltage outputs are contemplated. The one or more redundant voltage regulators 305 preferably are tightly controlled to supply the lower voltage levels produced and supplied to the memory module 325 and memory devices 350.

The different voltage levels supplied by the one or more redundant voltage regulators 305 preferably are the same as the different voltage levels provided by the on-board voltage regulators 370, and different than, preferably lower than, the voltage level provided by the external voltage regulator 360. In the example of FIGS. 3 and 4, where the on-board voltage regulator 370 supplies a first voltage (e.g., 1.1 volts) to a first voltage or power domain 380, the redundant voltage regulator 305 preferably supplies the same first voltage (e.g., 1.1 volts) to the memory module 325, and to the first voltage or power domain 380. Similarly, where the on-board voltage regulator 370 supplies a second voltage (e.g., 1.8 volts) to a second voltage or power domain 385, the redundant voltage regulator 305 preferably supply the same second voltage (e.g., 1.8 volts) to the memory module 325, and to the second voltage or power domain 385. The power supplied by the one or more redundant voltage regulators 305 to the voltage domains 380, 385 preferably is in parallel with the power supplied by the one or more on-board voltage regulators 370. Where the one or more on-board voltage regulators 370 supply or output additional voltage (power) signals to additional voltage (power) domains or planes on a memory module 325, the one or more external redundant voltage regulators 305 preferably supply the same additional voltage (power) signals to the memory module 325, and the memory module 325 preferably is configured to route those additional voltage (power) signals to the voltage (power) domains or planes, and/or components that receive that same additional voltage (power) signal from one or more the on-board voltage regulators 370.

Figure 6:
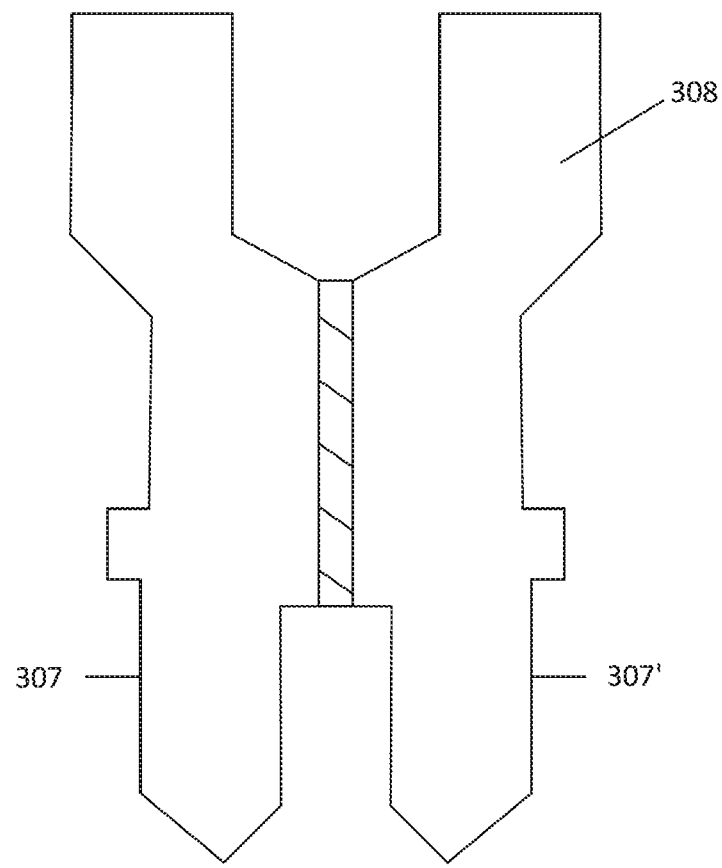
FIG. 6 depicts a front elevation view of a two blade power pin in accordance with one embodiment.

The one or more redundant voltage regulators 305 supply one or more power signals to the memory module 325 preferably through one or more blade pins 308 as shown in FIGS. 5 and 6. Each pin 307 on blade pin 308 is electronically isolated from the other pin 307' to supply different regulated voltage levels to the memory module 325. The blade pin 308 and each of pins 307 may be more robust when compared to the signal pins 315 to enable higher currents with less resistance. The blade pin 308, and specifically each of the pins 307 providing a different voltage level, makes contact with contact pads 317, 317' on the memory module 325. The blade pins 308 are contained within socket 310 (shown in FIG. 4). In the example of FIGS. 3-6, two different regulated voltages are supplied by the redundant voltage regulator 305 to the memory module 325 so two pins 307, 307' are provided on blade pin 308. More blade pins 308 may be provided to provide more or less regulated voltages to the memory module 325 from the one or more redundant voltage regulators 305. As more or less voltage levels are provided to the memory module 325, more or less contact pads 317 may be required on the memory module 325. In FIG. 4, redundant voltage regulator 305 is shown on a system board 302, back plane 365 of a server that has a first voltage plane 366 (e.g., 1.1 volts) contacting first pin 307 and a second voltage plane 368 (e.g., 1.8 volts) contacting second pin 307' on blade pin 308.

Signal or power lines connect contact pads 317, 317' on the memory module 325 to voltage (power) domains or lines 380, 385. The power domains 380, 385 are configured and arranged on the memory module 325 so that the one or more redundant power regulators 305 supply power to the domains 380, 385 in parallel with one or more on-board voltage regulators 370. That is, the voltage or power domains 380 and 385 are connected to the contact pads 317, 317' on the memory module 325 in parallel with the power output (voltage) 372, 374 supplied by the on-board voltage regulator(s) 370. The contact pads 317, 317' on the memory module contact pins 307, 307' on the blade pin 308 when the memory module 325 is inserted into socket 310 (which pins are connected to the output of the redundant voltage regulator 305). In the example of FIG. 3, the redundant power regulator 305 outputs a first voltage (e.g., 1.1 volts), which is supplied to the voltage domain 380 through voltage plane 366, pin 307, and contact pad 317, and a second voltage (e.g., 1.8 volts), which is supplied to the voltage domain 385 through voltage plane 368, pin 307', and contact pad 317'.

The power distribution on the memory module 325 preferably allows for the one or more on-board voltage regulators 370 and the one or more external redundant voltage regulators 305, which are not mounted in the memory module 325, to jointly supply power to the components, including the memory devices 350, on the memory module 325. The redundant voltage regulator(s) 305 in one embodiment is always actively on (when the system memory is on) and providing power (voltage) with the on-board voltage regulator(s) 370 to the voltage (power) domains. The redundant voltage regulator(s) 325 preferably continues to supply power to the memory module 325, including the memory devices and non-memory devices, when one or more of the on-board voltage regulators 370 fail. In one embodiment, the redundant voltage regulator 305 may only supply power to the memory module 325, and voltage domains 380, 385 upon the on-board voltage regulator(s) 370 failing or upon impending failure of the on-board voltage regulator 370. In one embodiment, the redundant voltage regulator 305 improves the signal integrity of the memory interface during peak memory access by keeping the voltage tolerance within voltage specification limits. The redundant voltage regulator 305 may improve voltage regulation and permit tighter voltage specification limits. As shown in FIG. 4, a single redundant, external voltage regulator 305 may supply multiple voltages to one or more memory modules 325. Alternatively, one or more voltage regulators 305 may supply voltages to one or more memory modules 325.

In one embodiment, a failing on-board voltage regulator (e.g., 370) can communicate with a Host that a memory module 325 needs attention or may need replacing. In one embodiment, an on-board voltage regulator can communicate via a signal output or line 390 that there has been a failure of the on-board voltage regulator, an impending failure of the on-board voltage regulator, a power event or other event that requires attention or replacement of an on-board voltage regulator 370 or replacement of the memory module 325.

Signal output 390 may communicate with the Host to alert the Host to an event or situation that needs assistance. In one embodiment, the on-board voltage regulator 370 may output a signal through output pin 390, also referred to as a Power good pin, to the memory control circuit 330 and/or the RCD 332 by signal line 392, and the memory control circuit 330 or RCD 332 may route that signal or (generate or route) a different signal to the Host via signal line 394. Alternatively or additionally, the on-board voltage regulator 370 may output a signal from output 390 through signal line 396 directly to a reserved for future use (RFU) pin on the memory module 325. Sending the signal from output 390 directly to an RFU pin by signal line 396 may provide faster notification to the Host. In one embodiment, the Host, in response to a signal indicating that attention is required, may read a register from the Power Management Integrated Circuit (PMIC) indicating whether the event or situation presents a recoverable or unrecoverable state, and/or whether the error is recoverable.

The system may respond to a signal from the on-board voltage regulator (directly or indirectly) in a number of manners. In one response, upon receiving a signal of an event, e.g., that an on-board voltage regulator has failed, is failing, or otherwise is in need of attention, the memory contents of that memory module 325, may be moved, transferred or otherwise stored in a safe medium, e.g., an alternative memory module or other storage medium, to be retrieved at a later time. Alternatively or additionally, the memory module with the event that needs attention, and in particular the memory devices on the memory module, can be utilized and accessed in reduced bandwidth frequency to enable securing of the memory contents of the memory devices on that memory module to a safer medium. That is, the Host (memory controller) could change the bandwidth of the memory channel to a slower speed (e.g., half rate) to ensure the data is securely transferred to another memory module or safer medium until the memory module with the fault signal or attention can be serviced. This slower speed may inhibit or prevent the system from crashing. In another embodiment, the Host may send a service request to replace the on-board voltage regulator and/or the memory module.

In one embodiment, the signal output 390 may be used to trigger the redundant, external voltage regulator to supply power to the memory module. In one aspect, the system may be designed and configured so that the redundant voltage regulator supplies, continues to supply, or is triggered to supply power to the memory module during the various responses to the notification received from the on-board voltage regulator output 390.

Figure 7:
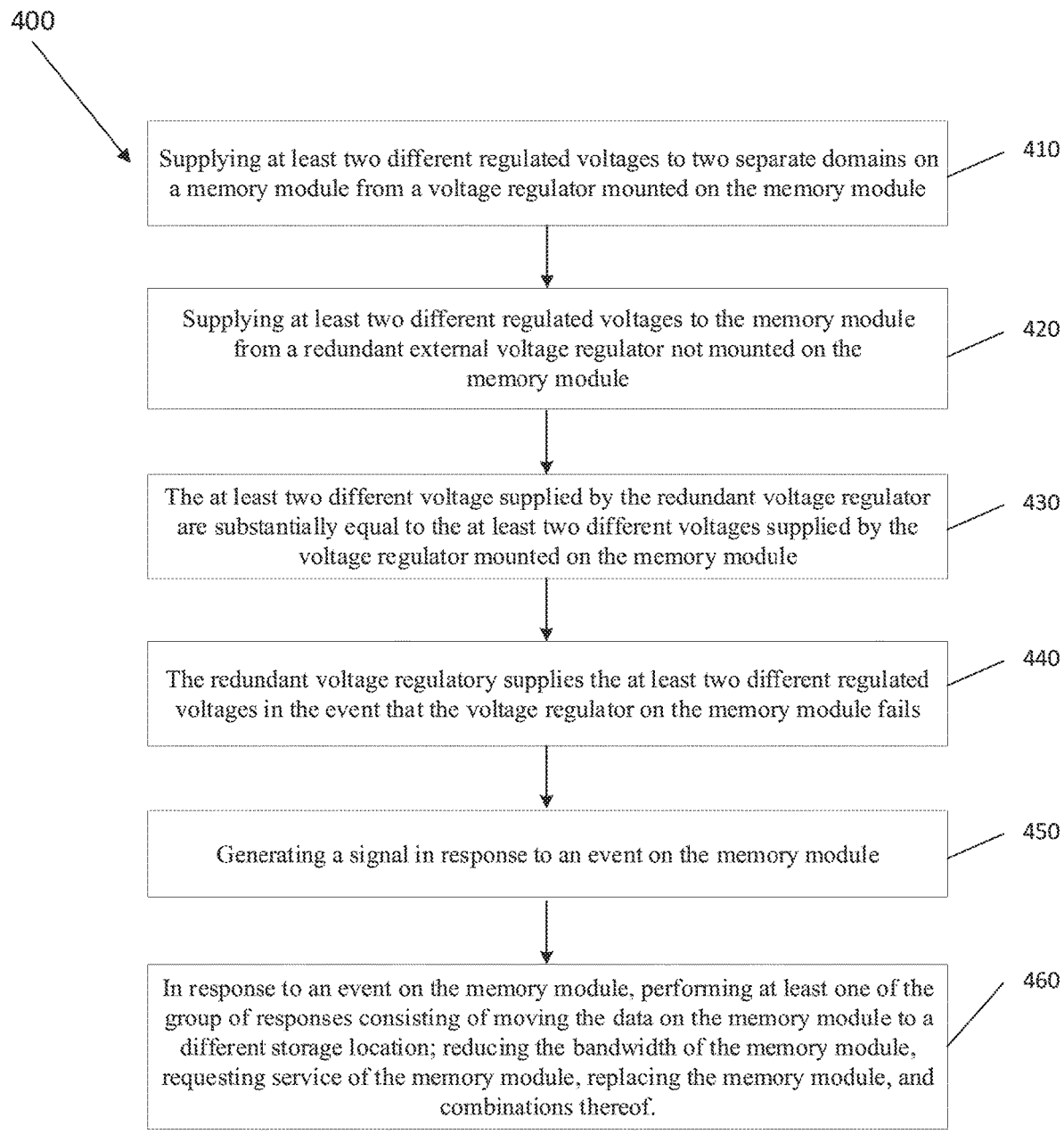
FIG. 7 depicts a flow diagram of a method for powering a memory system in accordance with one embodiment.

FIG. 7 is an exemplary flowchart in accordance with one embodiment illustrating and describing a method of powering a memory system, including memory devices and/or memory modules, such as, for example DIMMs, in accordance with one embodiment of the present disclosure. While the powering method 400 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 4, but the process may be integrated and/or one or more steps may be performed together, simultaneously, or the steps may be performed in the order disclosed or in an alternate order.

The method 400 of powering a memory system, subsystem, module or memory devices may include, at 410, supplying at least two different, regulated voltages to at least two separate voltage or power domains, also referred to as voltage or power planes, on a memory module from one or more, and preferably a single, voltage regulator mounted on the memory module. For example, 1.1 volts and 1.8 volts may supplied by a single voltage regulator module on a memory module, such as, for example, a DIMM. Additional, different regulated voltages (e.g., 1.5 volts) may be supplied by the one or more, and preferably a single voltage regulator mounted on the memory module, also referred to as an on-board voltage regulator module, or an additional on-board voltage regulator, to separate, different power domain(s) on the memory module. The on-board voltage regulator is typically supplied with a higher voltage, such as, for example, twelve (12) volts, that it regulates and outputs to the power domains or to the components on the memory module. The on-board voltage regulator also may be supplied with source power, e.g., a voltage, such as for example 3.3 volts, to run its circuits. The source power supplied to the on-board voltage regulator to run its circuits preferably is separate from the voltage supplied to the on-board voltage regulator that the on-board voltage regulator regulates and outputs to power the memory devices, and/or the memory module. The method at 420 includes further supplying at least two different, regulated voltages to the memory module from one or more, and preferably a single redundant external voltage regulator, preferably not mounted on the memory module. At 430, the method includes supplying the at least two different voltages supplied by the one or more, and preferably a single redundant voltage regulator that are substantially equal to, and preferably equal to, the at least two voltages supplied by the one or more voltage regulators mounted on the memory module. In one aspect, in the event one of the voltage regulators on the memory module fails, the method at 440 includes continuing to supply, supplying, or starting to supply the at least two different regulated voltages to the memory module from the one or more, and preferably single redundant voltage regulator.

At 450, in one aspect the method includes generating a signal in response to an event on the memory module, and in particular in response to an event with one or more of the on-board voltage regulators. Such events may include, but are not limited to, on-board voltage regulator failure, an event that needs attention, an impending on-board voltage regulator failure, instability in one or more of the on-board voltage regulators, or voltage outputs of the one or more on-board voltage regulators that are not within specification. In response to an attention signal delivered or output by one of the on-board voltage regulators or memory module, one or more responses may be undertaken. In response to an event on the memory module, and in particular in response to an event with one or more of the on-board voltage regulators that needs attention, the method at 460 includes moving data on the memory module to a different storage location, for example, a different memory module, or a different storage medium. Alternatively or additionally, in response to an event with the memory module including an event with one of the on-board voltage regulators mounted on the module, throttling or reducing the bandwidth of the memory channel or channels on that memory module to slow the speed of processing on that memory module. Alternatively or additionally, a service request can be made for one or more of the on-board voltage regulators and/or the memory module, including a service request to replace one or more of the on-board voltage regulators and/or memory module. Other responses to a faulty or problem detected with the memory module and/or one of the on-board voltage regulators are contemplated.

In one embodiment a system is disclosed including at least one memory module including a plurality of dynamic random access memory devices mounted on the module, and a first voltage regulator mounted on the module, the first voltage regulator configured to supply at least one of a plurality of voltages to a plurality of voltage domains for supplying voltage to the plurality of memory devices, and a system board including a second external voltage regulator configured to supply voltage to the first voltage regulator, and a third redundant voltage regulator, the third redundant voltage regulator configured to supply at least one of a plurality of voltages to the plurality of voltage domains on the memory module, wherein the at least one of the plurality of voltages supplied by the third redundant voltage regulator is the same as the at least one voltage supplied by the first voltage regulator.

In one embodiment, the third voltage regulator supplies the plurality of voltages to the voltage planes on the at least one memory module through a plurality of blade pins. In one aspect, the third voltage regulator is configured to continue to supply voltage to the plurality of voltage domains on the memory module in the event that the first voltage regulator fails. The third voltage regulator may supply the at least one of a plurality of voltages to the plurality of voltage domains in parallel to the at least one of the plurality of voltages supplied by the first voltage regulator.

The memory module in one embodiment is configured to send a signal to the system board in response to an impending first voltage regulator failure. The signal sent to the system board upon impending failure of the first voltage regulator can be received from at least one of a RCD device mounted on the module, a special RFU pin on the module, or both. In one embodiment, the third voltage regulator is always actively on and supplying power to the at least one of voltage domains on the memory module along with the first voltage regulator. The system may perform a power-up sequence of the third voltage regulator after a power-up sequence of the first voltage regulator has completed. In one mode, the memory devices can be accessed in reduced bandwidth frequency to secure the memory content of the memory devices. The third voltage regulator may improve the signal integrity of the memory devices by improving voltage tolerance of at least one voltage domain on the memory module. In one aspect, the third voltage regulator supplies at least one of a plurality of voltages to a plurality of memory modules.

In another embodiment, a memory subsystem is disclosed having at least one memory module, the memory module having a substrate to which a plurality of memory chips is mounted and a voltage regulator, the voltage regulator receiving a power supply signal from a system power supply and outputting two or more power signals, each power signal providing a different, regulated voltage, which regulated voltages are each routed to each of the memory chips; and a redundant voltage regulator external to and not mounted on the memory module and configured to output two or more power signals, providing external different, regulated voltages which are the same voltages as the voltages output by the voltage regulator on the memory module, and supplying the two or more signals to the memory module.

The redundant voltage regulator may output two or more power signals of different regulated voltage to a plurality of memory modules. Each of the different regulated voltages supplied to the memory module by the redundant voltage regulator preferably are less than six (6) volts. The at least one memory module in one embodiment is configured and adapted so that the plurality of voltages supplied by the redundant voltage regulator are parallel to the two or more power signals output by the memory voltage regulator.

A method of powering memory devices is also disclosed that includes supplying at least two different, regulated voltages from a voltage regulator mounted on a memory module to two separate voltage domains; and supplying at least two different, regulated voltages from a redundant voltage regulator to the memory module, the at least two different regulated voltages supplied by the redundant voltage regulator being the same voltages supplied by the voltage regulator mounted on the memory module. In one aspect of the method, the redundant voltage regulator continues to supply the at least two different regulated voltages in the event the voltage regulator on the memory module fails. The method may include generating a signal when the voltage regulator on the memory module fails. In one embodiment, the method further includes moving the data from the plurality of memory devices to a safe location in the event the voltage regulator on the memory module fails. The method may further include the redundant voltage regulator suppling power to the memory module through a larger blade pin to handle the increased current of supplying power at lower voltage.

In another embodiment, a memory module is disclosed that includes a plurality of memory devices and a voltage regulator, the voltage regulator configured to receive a first power signal of a first voltage level and output at least a second and third power signal, each of the second and third power signals providing second and third different regulated, voltage levels each lower than the first voltage level, wherein the module is configured and adapted to receive the first power signal of the first voltage level and supply the first power signal to the voltage regulator, and wherein the module is configured and adapted to receive a fourth and fifth power signal, the fourth power signal having a voltage level equal to the second voltage level, and the fifth voltage level equal to the voltage of the third voltage level, wherein the fourth voltage level is supplied in parallel to the second voltage output by the voltage regulator, and the fifth voltage is supplied in parallel to the third voltage output by the voltage regulator.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   at least one memory module having a circuit, the at least one memory module including a plurality of dynamic random access memory devices having a circuit mounted on the module, and a first voltage regulator having a circuit mounted on the module, the first voltage regulator configured to supply at least one of a plurality of voltage levels to a plurality of voltage domains on the memory module for supplying voltage to the plurality of memory devices, and
   a system board including a second voltage regulator having a circuit configured to supply voltage to the first voltage regulator, and a third redundant voltage regulator, the third redundant voltage regulator having a circuit configured to supply at least one of the plurality of voltage levels to the plurality of voltage domains on the memory module, wherein the at least one of the plurality of voltage levels supplied by the third redundant voltage regulator is the same voltage level as the at least one voltage level supplied by the first voltage regulator,
   wherein the third redundant voltage regulator is configured to supply power to at least one of the voltage domains on the memory module along with the first voltage regulator.

2. The system of claim 1, wherein the third redundant voltage regulator supplies the plurality of voltage levels to the voltage domains on the at least one memory module through a plurality of blade pins.

3. The system of claim 1, wherein the third redundant voltage regulator is configured to continue to supply voltage to the plurality of voltage domains on the memory module in the event that the first voltage regulator fails.

4. The system of claim 1, wherein, the third voltage regulator is configured to supply the at least one of a plurality of voltage levels to the plurality of voltage domains in parallel to the at least one of the plurality of voltage levels supplied by the first voltage regulator.

5. The system of claim 1, wherein the memory module is configured to send a signal to the system board in response to an impending first voltage regulator failure.

6. The system of claim 5, wherein the signal sent to the system board upon the impending failure of the first voltage regulator can be received from at least one of a RCD device mounted on the module, a special RFU pin on the module, or both.

7. The system of claim 1, wherein the third redundant voltage regulator supplies power to the memory module through a larger blade pin so as to handle the increased current in the event of supplying power at lower voltage.

8. The system of claim 1, wherein the system is configured so that a power-up sequence of the third voltage regulator occurs after a power-up sequence of the first voltage regulator has completed.

9. The system of claim 1, wherein the memory devices are configured to be accessed in reduced bandwidth frequency to secure the memory content of the memory devices in response to an event.

10. The system of claim 1, wherein the third redundant voltage regulator improves the signal integrity of the memory devices by improving voltage tolerance of at least one voltage domain on the memory module.

11. The system of claim 1, wherein the third redundant voltage regulator is configured to supply at least one of a plurality of voltage levels to a plurality of memory modules.

12. The system of claim 1, wherein the third redundant voltage regulator is configured to supply 1.1 volts and 1.8 volts, and the second voltage regulator is configured to supply at least one voltage level including 12 volts.

13. A memory subsystem comprising:
    at least one memory module having a substrate to which a voltage regulator and a plurality of memory chips having one or more circuits is mounted, the voltage regulator having a circuit configured to supply a power supply signal from a system power supply and to output two or more power signals, each power signal providing a different, regulated voltage level, which regulated voltage levels are each configured to be routed to each of the plurality of memory chips; and
    a redundant voltage regulator external to and not mounted on the memory module and configured to output two or more power signals providing external different, regulated voltage levels which are the same voltage levels as the voltage levels output by the voltage regulator mounted on the memory module,
    wherein the redundant voltage regulator is configured to be always actively on and supplying at least one of the two or more power signals to the memory module; and
    wherein the redundant voltage regulator supplies power to the memory module through a larger blade pin to handle the increased current of supplying power at lower voltage.

14. The memory subsystem of claim 13, wherein the redundant voltage regulator is configured to output two or more power signals of different regulated voltage levels to a plurality of memory modules.

15. The memory subsystem of claim 13, wherein the at least one memory module is configured and adapted so that the plurality of voltage levels supplied by the redundant voltage regulator are parallel to the two or more power signals output by the memory voltage regulator.

16. The memory subsystem of claim 13, wherein the redundant voltage regulator is configured to output at least one of the two or more power signals to at least a power domain on the memory module along with at least one of the two power signals from the voltage regulator.

17. A method of powering memory devices comprising:
    supplying at least two different, regulated voltage levels from a voltage regulator mounted on a memory module to two separate voltage domains on the memory module, wherein the memory module comprises a plurality of memory devices having circuits and the memory devices are configured to store data;
    supplying at least two different, regulated voltage levels from a redundant voltage regulator to the memory module, the at least two different regulated voltage levels supplied by the redundant voltage regulator being the same voltage levels supplied by the voltage regulator mounted on the memory module; and
    moving the data from the plurality of memory devices to a safe location in the event the voltage regulator on the memory module fails.

18. The method of claim 17, wherein the redundant voltage regulator continues to supply the at least two different regulated voltage levels in the event the voltage regulator on the memory module fails.

19. The method of claim 17, further comprising generating a signal when the voltage regulator on the memory module fails.

20. The method of claim 17, wherein the redundant voltage regulator supplies power to the memory module through a larger blade pin to handle the increased current of supplying power at lower voltage.

* * * * *